United States Patent [19]

Gluck et al.

[11] Patent Number: 4,849,375
[45] Date of Patent: Jul. 18, 1989

[54] GASEOUS CLEANING METHOD FOR SILICON DEVICES

[75] Inventors: Ronald Gluck; David P. Hamblen, both of Rochester, N.Y.

[73] Assignee: Eastman Kodak Company, Rochester, N.Y.

[21] Appl. No.: 289,062

[22] Filed: Dec. 23, 1988

[51] Int. Cl.[4] .................... H01L 21/00; H01L 21/02; H01L 21/30; H01L 21/306
[52] U.S. Cl. ............................ 437/225; 148/DIG. 17
[58] Field of Search ............... 437/225, 237, 239, 242, 437/244; 148/DIG. 17

[56] References Cited
U.S. PATENT DOCUMENTS
4,159,917  7/1979  Gluck ................................. 437/13

OTHER PUBLICATIONS

Ghandhi, S; VLSI Fabrication Principles, Chapter 9, Wiley & Sons, 1983.
Wolf, S; Silicon Processing for the VLSI Era, Chapters 15 & 16, Lattice Press, 1986.
Sze, S; VLSI Technology, Chapter 8, McGraw-Hill, 1983.

*Primary Examiner*—Brian E. Hearn
*Assistant Examiner*—B. Everhart
*Attorney, Agent, or Firm*—Raymond L. Owens

[57] ABSTRACT

A method for cleaning the surface of a silicon semiconductor device comprising the steps of:

(a) exposing, for a first time, said device for a predetermined time period to an anhydrous cleaning gas mixture containing nitric oxide and hydrogen chloride together with an inert carrier gas; and (b) exposing, for a second time, said device for a predetermined second time period to a gaseous plasma formed of $CF_4$, $H_2$ and $N_2$ at RF power.

6 Claims, 1 Drawing Sheet

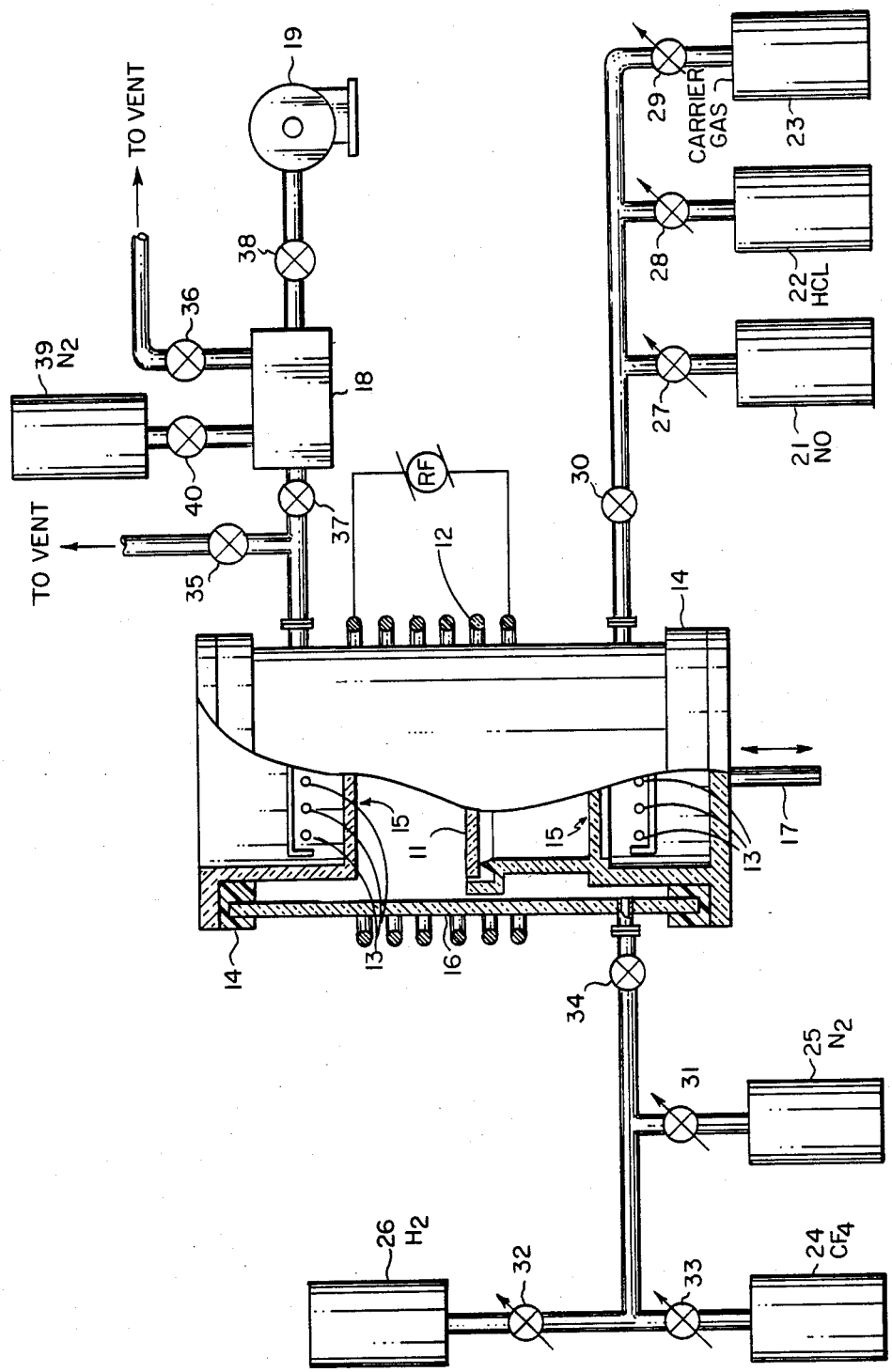

GASEOUS CLEANING METHOD FOR SILICON DEVICES

FIELD OF THE INVENTION

This invention relates to an improved method for cleaning the surfaces of silicon devices.

BACKGROUND ART

The manufacture of semiconductor (silicon) devices such as silicon integrated circuits and charge coupled devices requires that impurities be kept from residing on the surface of such devices. Impurities such as copper, iron and gold are especially troublesome since they form undesirable charge traps at device surfaces, and can diffuse into the silicon bulk to form hot spots for noise sources, which adversely affect device performance.

Devices formed from a silicon wafer employing processing steps generally include:

(a) thermal diffusion of dopants into the silicon; and
(b) the thermal growth of an oxide over regions of the silicon.

Before each thermal step, it is customary to clean the silicon wafer. Typically this is done by: exposing the wafer to aqueous solutions of ammonium hydroxide and hydrogen peroxide; rinsing, for a first time, the wafer with deionized water and exposing the wafer to aqueous solutions of hydrochloric acid and hydrogen peroxide; and rinsing, for a second time, the wafer with deionized water. Such a technique, while working to clean away trace amounts of impurities, leaves something to be desired, primarily because it requires handling and processing by wet solutions; and because it takes a fair amount of processing time. Also, particulates present in all liquid reagents tend to become attached to the wafers, where they can create shorts and opens on finely patterned structures.

U.S. Pat. No. 4,159,917 discloses a gaseous cleaning process in which nitric oxide and anhydrous hydrochloric acid are used together with a carrier gas of molecular nitrogen in a temperature range of 850 to 1100° C. While quite effective to remove metallic impurities from the wafers, it has a drawback in that an undesired reaction occurs simultaneously with the silicon in which a film of approximately 75 Å thickness containing silicon, oxygen, nitrogen and chloride is formed (silicon oxynitrochloride). This film prevents a more efficient cleaning of silicon surfaces and frequently inhibits subsequent operations, such as thermal oxidation and dopant diffusion.

BRIEF DESCRIPTION OF THE DRAWING

The drawing schematically illustrates in cross-section apparatus for practicing this invention shown in cross-section.

SUMMARY OF THE INVENTION

It is an object of this invention to make use of a gaseous cleaning process while also removing the film of oxynitrochloride.

In accordance with this invention, while eliminating the undesirable silicon oxynitrochloride film, the thin film of silicon oxynitrochloride is removed in a gaseous plasma formed by RF excitation of a mixture of $CF_4$, $N_2$ and $H_2$ at a temperature between 115° C.–200° C. The elimination of the silicon oxynitrochloride film eliminates the inhibition of subsequent fabrication operations such as thermal oxidation and dopant diffusion and allows for improved cleaning by repetition of the cycle. The efficient filtration of reagent gases minimizes particulate exposure common to liquid reagents.

MODE OF CARRYING OUT THE INVENTION

Referring to the drawing, a system for practicing the invention employs a source 21 of nitric oxide, a source 22 of anhydrous hydrochloric acid, a source 23 of inert carrier gas such as nitrogen, argon, etc., a source 24 of carbon tetrafluoride, a source 26 of hydrogen, and two sources 25 and 39, respectively, of nitrogen. Adjustable valves 27, 28, 29, 31, 32 and 33 regulate the flow of gases from their corresponding sources. On-off solenoid valves 30, 34, 35, 36 and 40 are used to initiate and terminate gas flows. A silicon wafer 11 is introduced into a reaction chamber 16 by raising and lowering a moveable platform 17. Vacuum gaskets 14 seal the chamber during gaseous processing. Heating of the wafer is accomplished by use of arrays of tungsten halogen flash lamps 13 and transparent sapphire windows 15. An RF coil 12, connected to an RF source, RF, is used to create a gaseous plasma. Reduced pressure operation is obtained using a mechanical vacuum pump 19, protected from corrosive reagents by cryotrap 18. Vacuum valves 37 and 38 permit system pumping or trap purging. It will be understood to those skilled in the art that appropriate temperature controls, and solenoid controls, not shown in the schematic, can be employed. Also not shown on the schematic are high purity gas filters 99.997% efficient for particles 0.02 microns and larger, which are located between the sources and the adjustable valves.

The cleaning process involves a minimum sequence of two steps. In the first step of the invention, adjustable valves 27, 28 and 29 can, for example, be set to deliver 112.5 cc/min, 135 cc/min and 2250 cc/min, respectively, nitric oxide from source 21, anhydrous hydrochloric acid from source 22 and inert carrier gas from source 23. A silicon wafer 11 to be cleaned is positioned in the apparatus by raising the mobile platform 17 such that a gaseous seal 14 is effected at the base of the quartz vessel 16.

Flow of the aforementioned cleaning gas is begun through the apparatus by opening solenoids 30 and 35 while keeping solenoid 34 and vacuum valve 37 closed. The wafer temperature is raised to between 850° C. and 1100° C. for 5 minutes to remove metallic impurities. Although a conventional diffusion furnace can be used, it will be understood to those skilled in the art that heating of the wafer using an array of tungsten halogen flashlamps is preferable because the wafer heating rate is higher, reducing the tendency for surface impurities to diffuse into the silicon bulk before being reacted by the cleaning gas. In the second step of the invention, adjustable valves 33, 32 and 31 are set to deliver a mixture of tetrafluoromethane from source 24, hydrogen from source 26 and nitrogen from source 25 which can, for example, be in the ratio of 1:1:2, respectively. A mechanical vacuum pump 19 is used to evacuate the apparatus 16, by closing solenoids 35, 34 and 30, and opening vacuum valves 37 and 38. A cryotrap with solenoids 36 and 40 closed is used to trap corrosive vapors resident from the first step. In one example, aforementioned etch gases were introduced to the system by opening solenoid 34, resulting in a system pressure of 0.4 Torr. The flashlamps 13 are adjusted to bring the wafer temperature to between 115° C. and 200° C. 150 watts of RF power at 13.56 megahertz is applied to coils 12 from a source RF. A plasma is formed in the region of the wafer which removes approximately 78 Å of silicon oxynitrochloride film from the wafer in 1 minute. The plasma attacks bare silicon at approximately 70 Å/min resulting in a selectivity of 1.1:1.

The cryotrap 18 is purged of condensed corrosive vapors by closing vacuum valves 37 and 38 and introducing a flow of nitrogen from source 39 by opening solenoid 36 and 40 while warming the trap from fluid nitrogen temperature.

Table 1 shown below illustrates the effect of parameter changes of step (a) on the cleaning efficiency for gold. Gold removal was studied because, due to its noble metal nature, it is considered one of the most difficult metal impurities to remove.

TABLE 1

| Flow Rates (cc/min) | | | (°C.) | (min) | % Gold |
|---|---|---|---|---|---|
| No | HCl | N₂ | Temp | Time | Removed |
| 67.5 | 67.5 | 2250 | 900 | 2 | 57.5 |
| 138 | 135 | 2250 | 900 | 5 | 67.4 |
| 225 | 67.5 | 2250 | 900 | 2 | 62.8 |
| 225 | 135 | 250 | 900 | 5 | 70.5 |
| 225 | 270 | 2250 | 900 | 5 | 69.9 |
| 112.5 | 67.5 | 2250 | 1000 | 5 | 88.6 |
| 225 | 67.5 | 2250 | 1000 | 1 | 65.0 |
| 135 | 135 | 2250 | 1000 | 1 | 62.9 |
| 225 | 135 | 2250 | 1000 | 3 | 65.9 |

During step (a) a film of silicon oxynitrochloride is formed. The film grows to a limiting thickness of approximately 80 Å at a rate determined by the temperature and process gas concentrations. Table 2 shown below shows typical film thickness under several process conditions.

TABLE 2

| Flow Rates cc/min | | | | Time | |
|---|---|---|---|---|---|
| No | HCl | N₂ | Temp (°C.) | (min) | Thickness (Å) |
| 235 | 235 | 4200 | 900 | 5 | 58 |
| 235 | 235 | 4200 | 900 | 10 | 62 |
| 235 | 235 | 4200 | 900 | 15 | 63 |
| 22.5 | 45 | 2300 | 1000 | 5 | 69 |
| 112.5 | 22.5 | 2365 | 1000 | 5 | 73 |
| 112.5 | 135 | 2250 | 1000 | 5 | 80 |
| 225 | 135 | 2255 | 1000 | 5 | 77 |

For convenience of experimental technique, the etch conditions for step (b) were optimized using thermal silicon dioxide ($SiO_2$) at 1000 Å instead of silicon oxynitrochloride ($SiO_xN_yCl_z$) at 80 Å thickness. The optimization process sought to maximize the etch rate of $SiO_2$ relative to silicon, so that a minimum loss of silicon would be realized during step (b). Table 3 below summarizes the selectivity values as a function of gas ratio, pressure and temperature at a constant power of 150 watts. The comparable selectivity of $SiO_xN_yCl_z$ is shown for the optimum etch condition as determined for $SiO_2$.

TABLE 3

| Film Material | Etch Gas CF₄ | H₂ | Ratio N₂ | Pressure (Torr) | Temperature °C. | Film Etch Rate Å/min | Si Etch Rate Å/min | Selectivity |
|---|---|---|---|---|---|---|---|---|
| SiO₂ | 1 | 1 | 2 | .39 | 115 | 47.5 | 85 | 1:1.8 |
| SiO₂ | 1 | 1 | 2 | .39 | 150 | 80 | 87 | .9:1.8 |
| SiO₂ | 1 | 2 | 4 | .35 | 130 | 52 | 49 | 1.1:1 |
| SiO₂ | 1 | 1 | 2 | .39 | 200 | 118 | 70 | 1.4:1 |
| SiO₂N_yCl_z | 1 | 1 | 2 | .37 | 200 | 78 | 70 | 1.1:1 |

An effective cleaning process used a cleaning gas composed of 112.5 cc/min nitric oxide, 67.5 cc/min anhydrous hydrochloric acid and 2250 cc/min nitrogen for 5 minutes at 1000° C.; followed by an etching plasma composed of 1 part tetrafluoromethane, 1 part hydrogen and 2 parts nitrogen at 0.37 Torr pressure, 200° C. and 150 watts of 13.56 megahertz RF power for 1 minute.

The cleaning efficiency of the two step method can be improved by repeating the steps (a) and (b) at least one more time. The cleaning efficiency at step (a) can be impaired by the growth of the silicon oxynitrochloride film which tends to bury the impurities, restricting access of cleaning gas and exit of volatile impurities. By removing the silicon oxynitrochloride at step (b), buried impurities are again made accessible for removal, so repetition of steps (a) and (b) improves the cleaning efficiency of the process.

After repetition of steps (a) and (b), the thermal diffusion of impurities from the surface into the volume of the materials is the only mechanism preventing total removal of the impurities. Therefore an optimized repetitive process which seeks to minimize thermal diffusion should result in shorter times for steps (a) and (b) than discussed for the simple two step process.

The chemistry of nitric oxide involves complex formation by either gain or loss of electrons. The gain or loss of electrons are facilitated by providing a source of energy to the molecule so that an excited state is created, such as in a plasma environment. The reactions of nitric oxide and impurities in step (a) can be carried out more efficiently in a high temperature plasma (850° C.–1100° C.). However, reactions in a plasma also can be carried out at a lower temperature than without such a plasma environment. Lower temperature reactions would be advantageous in reducing the thermal diffusion of impurities and would enhance cleaning efficiency during step (a).

The invention has been described in detail with particular reference to a preferred embodiment thereof, but it will be understood that variations and modifications can be effected within the spirit and scope of the invention.

We claim:
1. A method for the manufacture of a silicon semiconductor device in which metallic impurities and a silicon oxynitrochloride film is removed from the surface of said device, said method comprising in sequence the steps of:
   (a) exposing, for a first time, said device for a predetermined time period to an anhydrous cleaning gas mixture containing nitric oxide and hydrogen chloride together with an inert carrier gas; and

(b) exposing, for a second time, said device for a predetermined second time period to a gaseous plasma formed of $CF_4$, $H_2$ and $N_2$ at RF power.

2. The method of claim 1 wherein sequence of steps (a) and (b) is repeated at least one more time.

3. The method of claim 1 wherein step (a) is carried out using an RF plasma of the cleaning gas mixture at temperatures below 1100° C.

4. The method of claim 3 wherein sequence of steps (a) and (b) is repeated a multiple number of times.

5. The method of claim 1 wherein during step (a) the device is heated between 850 to 1100° C. and in step (b) the device is heated between 115° C. and 200° C.

6. The method of claim 5 wherein steps (a) and (b) is repeated a multiple number of times.

* * * * *